Nov. 4, 1958 S. P. WOLSKY 2,859,141

METHOD FOR MAKING A SEMICONDUCTOR JUNCTION

Filed April 30, 1954

INVENTOR
SUMNER P. WOLSKY
BY Elmer J. Gorn
ATTORNEY

United States Patent Office 2,859,141

Patented Nov. 4, 1958

2,859,141

METHOD FOR MAKING A SEMICONDUCTOR JUNCTION

Sumner P. Wolsky, Waltham, Mass., assignor to Raytheon Manufacturing Company, Waltham, Mass., a corporation of Delaware Application April 30, 1954, Serial No. 426,835

2 Claims. (Cl. 148—1.5)

This invention relates to methods for making semiconductor junctions of the fusion type.

Fusion type junctions are normally made by placing a small quantity of doping material selected from the third or fifth group of elements in the periodic table, such as indium or antimony, on a chip of semiconductor material from the fourth group of elements in the periodic table, such as germanium or silicon, and heating to a temperature above the melting point of the doping material and below that of the semiconductor material and then permitting the mass to cool slowly, usually for five minutes or more, to form a junction. With this process, the molten doping material dissolves a certain amount of the semiconductor. When the liquid cools, the dissolved semiconductor recrystallizes out with a predetermined concentration of the doping material to form the junction. However, if the cooling is allowed to take place slowly, relatively large irregular shaped crystals are formed leaving an irregular boundary with voids between the doping material and the doped semiconductor. This junction is mechanically weak so that it is vulnerable to mechanical strains occurring during further processing, transportation and use.

It has been found that there is a critical rate at which the doping material must be cooled through the range of recrystallization temperatures. Below this rate an undesirable boundary region of coarse crystals is formed and above this rate a desirable smooth boundary region of fine crystals is formed. By the process of this invention, the junction is cooled through the range of temperatures at which recrystallization takes place at a rate greater than this critical rate. In the case of indium and germanium, the cooling is done in less than thirty seconds as opposed to the normal cooling period of five minutes. As a result, the recrystallization of the semiconductor takes place much more rapidly and large irregular crystals do not have time to form. The layer of the desired conductivity is composed of microscopically small particles with few, if any, voids. The result is a smoother and more uniform junction that is not as likely to change with age.

The foregoing and other advantages, objects, and features of the invention will be better understood from the following description taken in conjunction with the accompanying drawings wherein.

Figure 1:
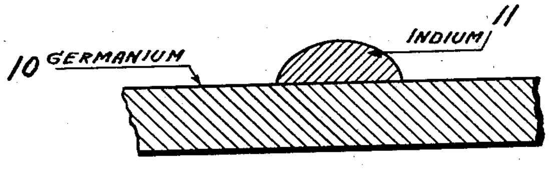
Fig. 1 is a section through a piece of semiconductor material with a small amount of doping material added.

In Fig. 1, the reference numeral 10 designates a body of semiconductor material, such as germanium or silicon, indicated in the drawing as being germanium. A small quantity 11 of a doping material from the third group of elements in the periodic table, such as indium or gallium, if a P-type of conductivity is desired for the boundary zone, or a doping material from the fifth group of elements in the periodic table, such as antimony, if an N-type of conductivity is desired for the boundary zone, is placed on the surface of the semiconductor body.

Figure 2:
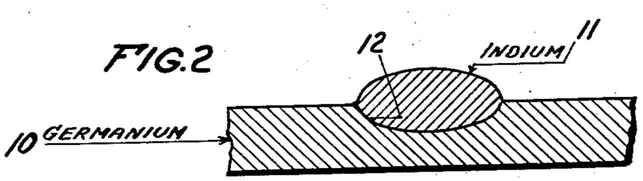
Fig. 2 is a section through the junction of Fig. 1 after heating.
Figure 3:
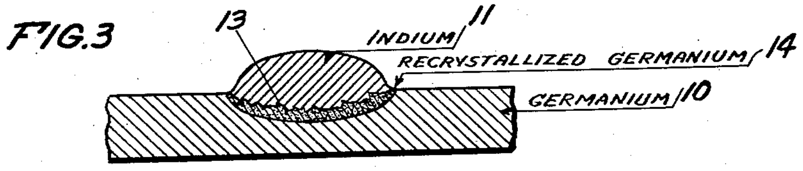
Fig. 3 is a section through the junction of Figs. 1 and 2, after normal cooling.

Fig. 2 shows the effect of heating the body to a temperature in excess of the melting point of the doping material 11 and below the melting point of the semiconductor body 10. In the case of indium and germanium, an appropriate temperature is 500 degrees C. As the doping material 11 melts, it dissolves a certain amount of the semiconductor 10 to form a shallow depression 12 filled with a pool of molten indium with germanium in solution.

If the material is allowed to cool slowly for say five minutes, the semiconductor in-solution crystallizes out with each crystal having a small concentration of the doping agent to form a layer of doped semiconductor 14 between the semiconductor and the solidified doping agent. This doped semiconductor material is composed of large irregular crystals which result in the rough boundary 13 between the solidified doping agent and the doped semiconductor.

Figure 4:
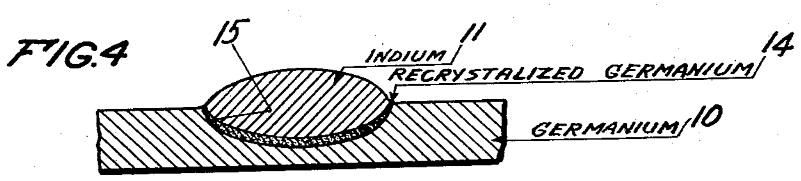
Fig. 4 is a section through the junction of Figs. 1 and 2 after the rapid cooling of the invention.

If, by the process of this invention, the material is quenched rapidly to a temperature below 100 degrees C., in the case of germanium and indium, with a period of less than thirty seconds, the germanium recrystallizes rapidly and the small microscopic crystals form a smooth boundary indicated by the line 15 between the solid doping agent 11 and the doped semiconductor 14, as seen in Fig. 4.

Figure 5:
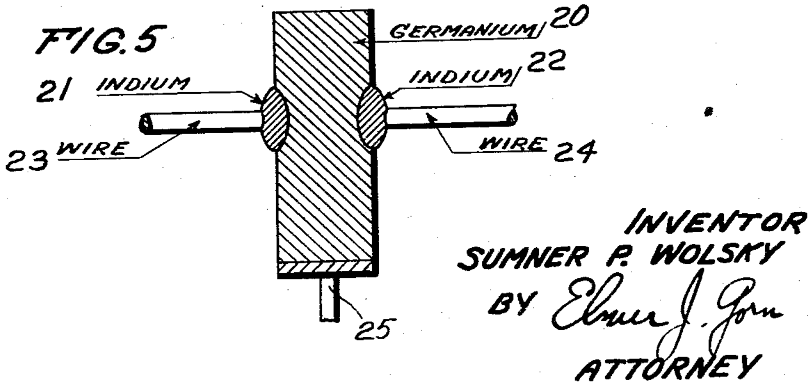
Fig. 5 is a junction transistor with the junctions formed by the methods of the invention.

Fig. 5 shows a section of a transistor made with two such junctions. The body 20 of germanium of the semiconductor has pieces 21 and 22 of indium or other doping agent located one on each side of the semiconductor chip. Conductors 23 and 24 are fastened one in each of these pieces of doping agent to act as emitter and collector terminals and a conductor 25 is electrically and mechanically attached to the germanium body to act as a base terminal, as may be seen in Fig. 5.

It has been found that the doped semiconductor layer formed in this way has five to ten times the resistivity of a doped semiconductor layer formed during a longer cooling period. This greater resistivity effects the characteristics of the transistors or diodes made with junctions formed in this manner.

This invention is not limited to the particular details of construction, materials and processes described, as many equivalents will suggest themselves to those skilled in the art. It is, accordingly, desired that the appended claims be given a broad interpretation commensurate with the scope of the invention within the art.

What is claimed is:

1. A method for making a semiconductor device comprising the steps of applying a small quantity of indium to one side of a body of germanium and heating to a temperature in excess of the melting point of the indium and below the melting point of the germanium body and cooling through the range of recrystallization temperatures in less than thirty seconds.

2. A method for making a semiconductor device comprising the steps of applying a small quantity of indium to one side of a body of germanium and heating to a temperature of approximately 500 degrees C. and cooling to a temperature of less than 100 degrees C. in less than thirty seconds.

References Cited in the file of this patent

UNITED STATES PATENTS

| | | |
|---|---|---|
| 2,402,661 | Ohl | June 25, 1946 |
| 2,428,992 | Ransley et al. | Oct. 14, 1947 |
| 2,441,603 | Storks et al. | May 18, 1948 |
| 2,603,692 | Scaff et al. | July 15, 1952 |
| 2,629,672 | Sparks | Feb. 24, 1953 |
| 2,631,356 | Sparks et al. | Mar. 17, 1953 |
| 2,683,676 | Little et al. | July 13, 1954 |
| 2,695,852 | Sparks | Nov. 30, 1954 |
| 2,721,965 | Hall | Oct. 25, 1955 |
| 2,725,315 | Fuller | Nov. 29, 1955 |
| 2,742,383 | Barnes et al. | Apr. 17, 1956 |

FOREIGN PATENTS

| | | |
|---|---|---|
| 695,178 | Great Britain | Aug. 5, 1953 |

OTHER REFERENCES

Proceedings of the Institute of Radio Engineers, vol. 40, No. 11, November 1952, pages 1341–1342. Article by Armstrong.

Electronics, October 1953, pp. 130–134.